(12) United States Patent
Bi et al.

(10) Patent No.: US 10,236,290 B2
(45) Date of Patent: Mar. 19, 2019

(54) METHOD AND STRUCTURE FOR IMPROVING VERTICAL TRANSISTOR

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/795,753

(22) Filed: Oct. 27, 2017

(65) Prior Publication Data

US 2018/0097000 A1    Apr. 5, 2018

Related U.S. Application Data

(62) Division of application No. 15/285,739, filed on Oct. 5, 2016, now Pat. No. 9,935,102.

(51) Int. Cl.
*H01L 27/08*    (2006.01)
*H01L 27/088*    (2006.01)
(Continued)

(52) U.S. Cl.
CPC .... *H01L 27/0886* (2013.01); *H01L 21/02233* (2013.01); *H01L 21/265* (2013.01);
(Continued)

(58) Field of Classification Search
None
See application file for complete search history.

(56) References Cited

U.S. PATENT DOCUMENTS 5,751,040 A    5/1998    Chen et al.
6,583,469 B1    6/2003    Fried et al.
(Continued)

OTHER PUBLICATIONS

Non-Final Office Action for U.S. Appl. No. 15/285,739 dated Jul. 5, 2017.
(Continued)

*Primary Examiner* — Benjamin P Sandvik
(74) *Attorney, Agent, or Firm* — Fleit Gutman Gutman Bongini Bianco PL; Thomas S. Grzesik

(57) ABSTRACT

A vertical fin field-effect-transistor and a method for fabricating the same. The vertical fin field-effect-transistor includes a first source/drain disposed in contact with a substrate. A second source/drain is disposed above the first source/drain. At least one fin structure is disposed between and in contact with the first source/drain and the second source/drain. A width of the first source/drain and the second source/drain gradually decreases towards the fin structure. The method includes forming an oxide in contact with an exposed portion of at least one fin structure. During formation of the oxide, different areas of the exposed fin structure portion are oxidized at different rates. This forms a first region and a second region of the exposed fin structure portion. These regions each have a width that is greater than a width of a third region of the exposed fin structure portion situated between the first and second regions.

18 Claims, 15 Drawing Sheets

(51) Int. Cl.
*H01L 29/78* (2006.01)
*H01L 29/06* (2006.01)
*H01L 29/66* (2006.01)
*H01L 21/306* (2006.01)
*H01L 21/265* (2006.01)
*H01L 29/417* (2006.01)
*H01L 21/8234* (2006.01)
*H01L 21/02* (2006.01)

(52) U.S. Cl.
CPC .............. *H01L 21/30604* (2013.01); *H01L 21/823431* (2013.01); *H01L 29/0692* (2013.01); *H01L 29/41791* (2013.01); *H01L 29/66553* (2013.01); *H01L 29/66666* (2013.01); *H01L 29/66795* (2013.01); *H01L 29/785* (2013.01); *H01L 29/7827* (2013.01); *H01L 21/823487* (2013.01)

(56) References Cited

U.S. PATENT DOCUMENTS

| | | | |
|---|---|---|---|
| 6,660,590 B2 | 12/2003 | Yoo | |
| 6,846,709 B1 | 1/2005 | Lojek | |
| 6,921,963 B2 | 7/2005 | Krivokapic et al. | |
| 7,033,877 B2 | 4/2006 | Chaudhry et al. | |
| 7,122,412 B2 | 10/2006 | Chen et al. | |
| 7,550,333 B2 | 6/2009 | Shah et al. | |
| 7,598,571 B2 | 10/2009 | Kim et al. | |
| 7,670,911 B2 | 3/2010 | Oyu | |
| 8,502,351 B2 | 8/2013 | Shah et al. | |
| 9,245,885 B1 | 1/2016 | Xie et al. | |
| 9,299,835 B1 | 3/2016 | Anderson et al. | |
| 9,312,179 B2 | 4/2016 | Lin et al. | |
| 2007/0082448 A1* | 4/2007 | Kim | H01L 27/10876 438/268 |
| 2009/0042347 A1* | 2/2009 | Oyu | H01L 29/0653 438/268 |
| 2011/0291107 A1 | 12/2011 | Ritenour et al. | |
| 2012/0025286 A1* | 2/2012 | Nojima | H01L 27/10823 257/296 |
| 2014/0264754 A1 | 9/2014 | Surthi | |
| 2015/0048293 A1 | 2/2015 | Park | |
| 2016/0163602 A1 | 6/2016 | Anderson et al. | |
| 2016/0163811 A1 | 6/2016 | Anderson et al. | |
| 2016/0204255 A1 | 7/2016 | Lin et al. | |

OTHER PUBLICATIONS

Notice of Allowance for U.S. Appl. No. 15/285,739 dated Oct. 5, 2017.

List of IBM Patents or Patent Applications Treated as Related.

* cited by examiner

METHOD AND STRUCTURE FOR IMPROVING VERTICAL TRANSISTOR

BACKGROUND OF THE INVENTION

The present invention generally relates to the field of semiconductors, and more particularly relates to a self-aligned vertical transistor.

Vertical transistors are a promising option for technology scaling for 7 nm and beyond. However, conventional vertical transistors sometimes suffer from extension resistance. In addition, conventional vertical transistors usually have asymmetry in device characteristics due to the formation of the bottom source/drain and top source/drain at different processing steps. This can lead to variation in vertical transistor circuits.

SUMMARY OF THE INVENTION

In one embodiment, a method for fabricating a vertical fin field-effect-transistor is provided. The method includes forming an oxide in contact with an exposed portion of at least one fin structure. During formation of the oxide different, areas of the exposed portion of the fin structure are oxidized at different rates. This forms a first region and a second region of the exposed portion. The first region and the second region each have a width that is greater than a width of a third region of the exposed portion situated between the first and second regions.

In another embodiment, a vertical fin field-effect-transistor is provided. The vertical field-effect-transistor includes a substrate and first source/drain disposed in contact with the substrate. A second source/drain is disposed above the first source/drain. At least one fin structure is disposed between and in contact with the first source/drain and the second source/drain. A width of the first source/drain and a width of the second source/drain gradually decrease towards the fin structure.

In yet another embodiment, an integrated circuit is provided. The integrated circuit includes a vertical fin field-effect-transistor. The vertical field-effect-transistor includes a substrate and first source/drain disposed in contact with the substrate. A second source/drain is disposed above the first source/drain. At least one fin structure is disposed between and in contact with the first source/drain and the second source/drain. A width of the first source/drain and a width of the second source/drain gradually decrease towards the fin structure.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
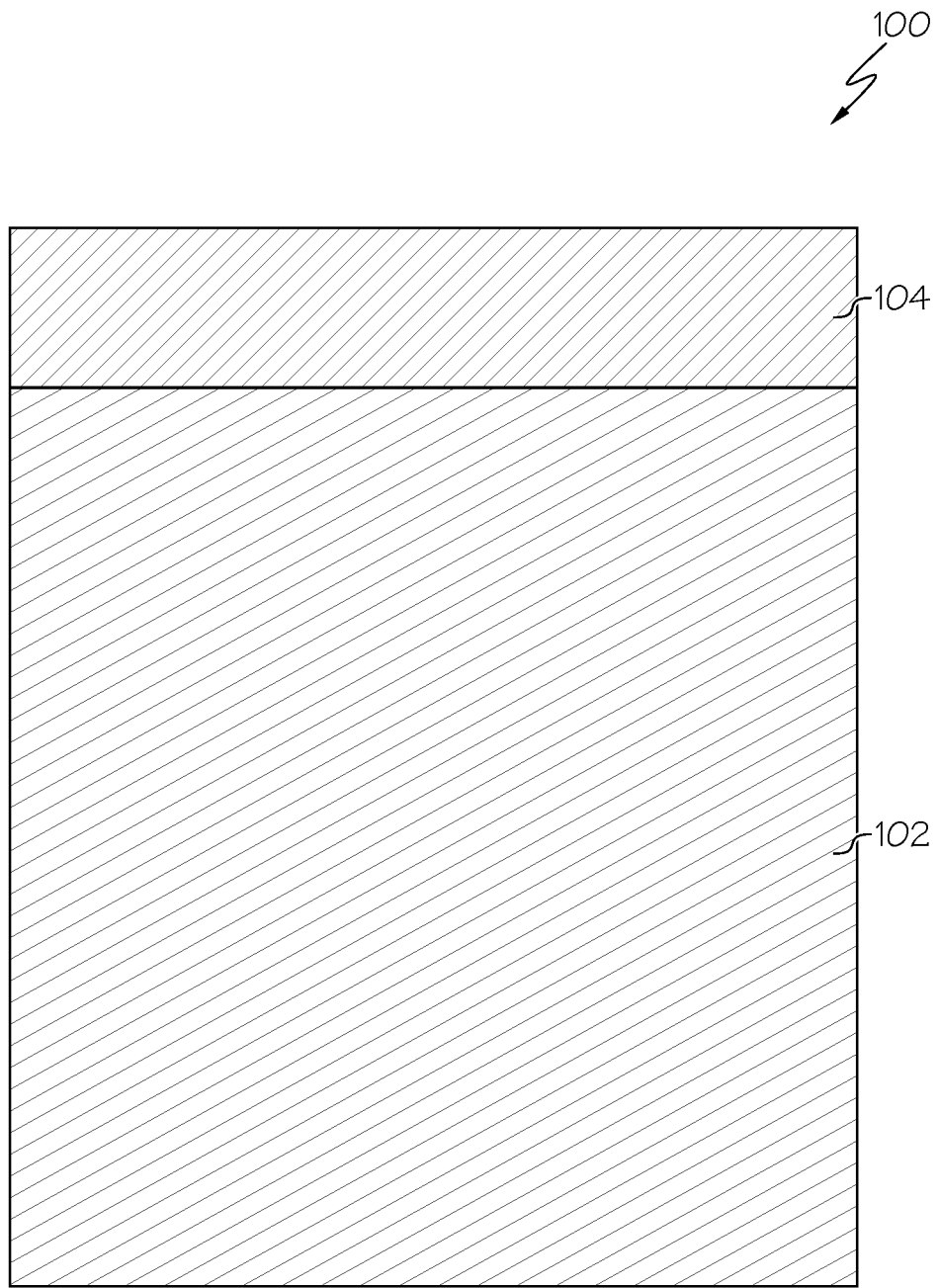
FIG. 1 is a cross-sectional view of an initial semiconductor structure according to one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-14 illustrate various processes for fabricating self-aligned vertical field-effect-transistors (VFETs). FIG. 1 shows a cross-section of a semiconductor structure 100 comprising a bulk semiconductor substrate 102 and a hardmask (cap) layer 104. The substrate 102, in one embodiment, comprises entirely of a semiconductor material. In other embodiments, the substrate 102 is a top semiconductor layer formed on handle substrate (not shown) or a semiconductor-on-insulator (SOI) substrate comprising a handle substrate and an insulator layer. The substrate 102, in one embodiment, includes a single crystalline semiconductor material or a polycrystalline material. In another embodiment, the substrate 102 includes an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

In yet another embodiment, the substrate 102 includes a single crystalline elemental semiconductor material, a single crystalline semiconductor material primarily composed of Group IV elements, a single crystalline III-V compound semiconductor material, a single crystalline II-VI compound semiconductor material, or a single crystalline organic semiconductor material. In a further embodiment, the semiconductor device layer 102 includes undoped single crystalline silicon or single crystalline silicon doped with p-type dopant atoms or n-type dopant atoms. Examples of materials for the semiconductor device layer 102 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multi-gate devices can be formed. In other embodiments, the substrate 102 is formed on and in contact with a handle substrate or an insulating layer disposed in contact with a handle substrate. In this embodiment, the handle substrate includes similar materials to those discussed above.

The hardmask layer 104, in one embodiment, is disposed on and in contact with the substrate 102 and includes a masking material(s) such as silicon oxide, silicon oxynitride, silicon carbide, silicon oxycarbide, silicon nitride, titanium nitride, tetraethyl orthosilicate, a combination thereof, and/or the like. The hardmask layer 104, in one embodiment, is formed using a process such as chemical vapor deposition (CVD), physical vapor deposition (PVD), atomic layer deposition (ALD), a combination thereof, and/or the like. In one embodiment, the first hardmask layer 104 is 20 nm to 100 nm thick, although lesser and greater thicknesses apply.

Figure 2:
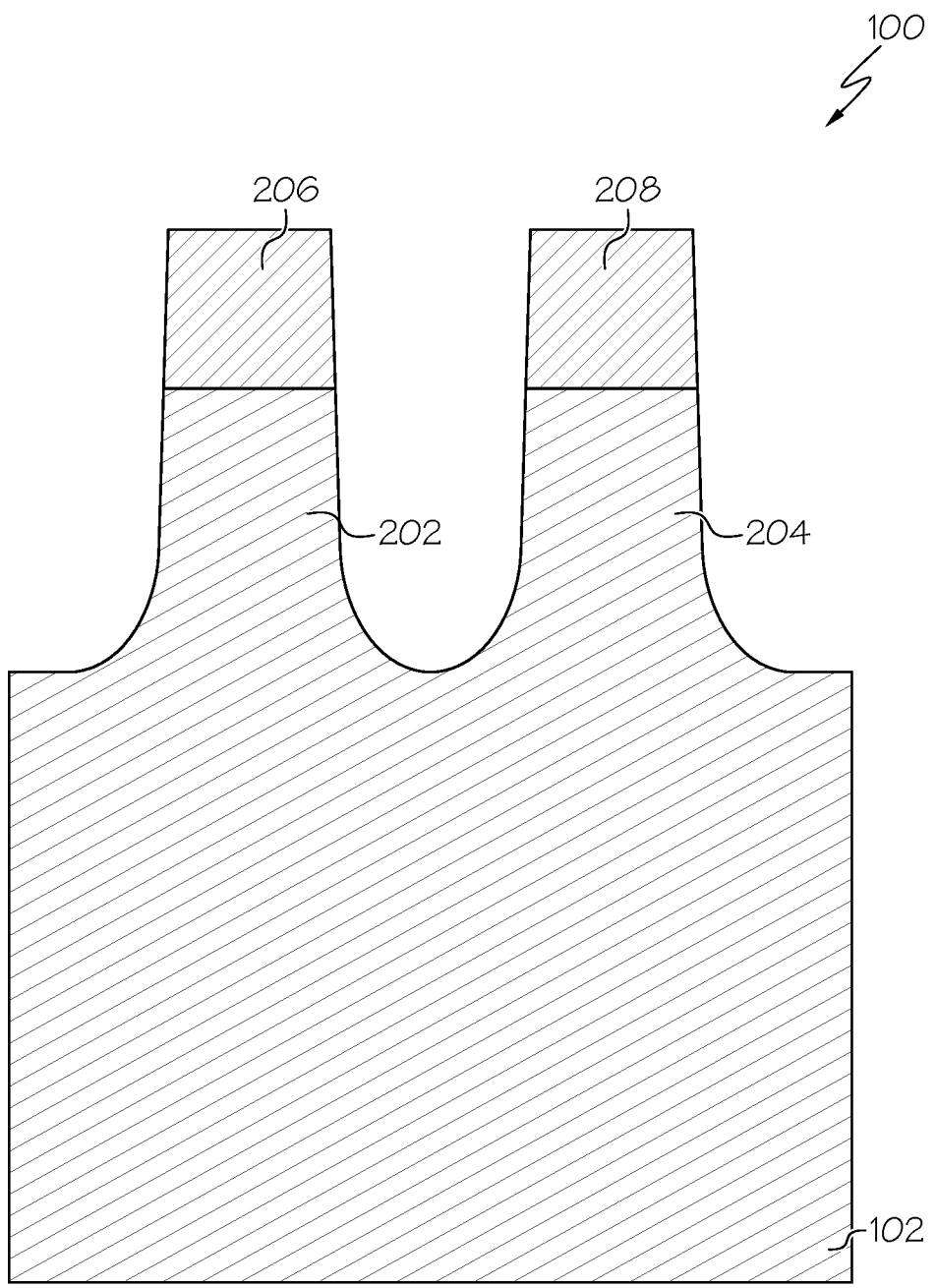
FIG. 2 is a cross-sectional view of the semiconductor structure after fin structures have been formed from a semiconductor substrate according to one embodiment of the present invention.

FIG. 2 shows the semiconductor structure 100 after fin structures 202, 204 with a hardmask (cap) 206, 208, have been formed from a portion of the substrate 102. The fins 202, 204 are formed, in one embodiment, through a process involving masking, using industry-standard lithographic techniques, and directionally etching a portion of the substrate 102 and hardmask layer 104 using, for example, reactive-ion-etching (RIE). In one embodiment, the etch depth ranges from 20-50 nm, although lesser and greater depths are applicable. The resulting fin structures 202, 204 have a tapered structure due to the lack of an etch stop. It should be noted that although FIG. 2 shows only two fin structures 202, 204 a lesser or greater number of fins can also be formed.

Figure 3:
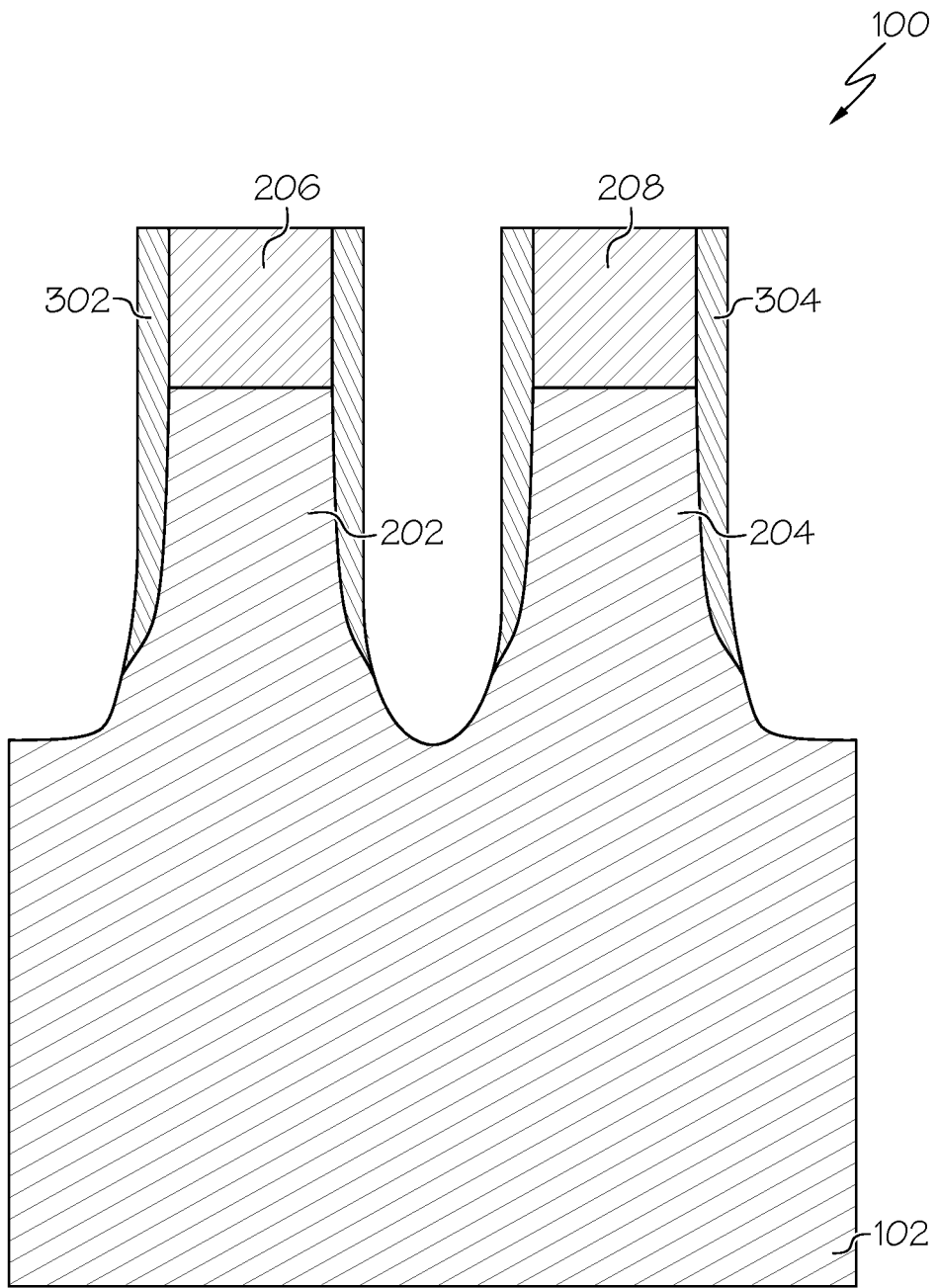
FIG. 3 is a cross-sectional view of the semiconductor structure after first spacers have been formed in contact with the fin structures according to one embodiment of the present invention.
Figure 4:
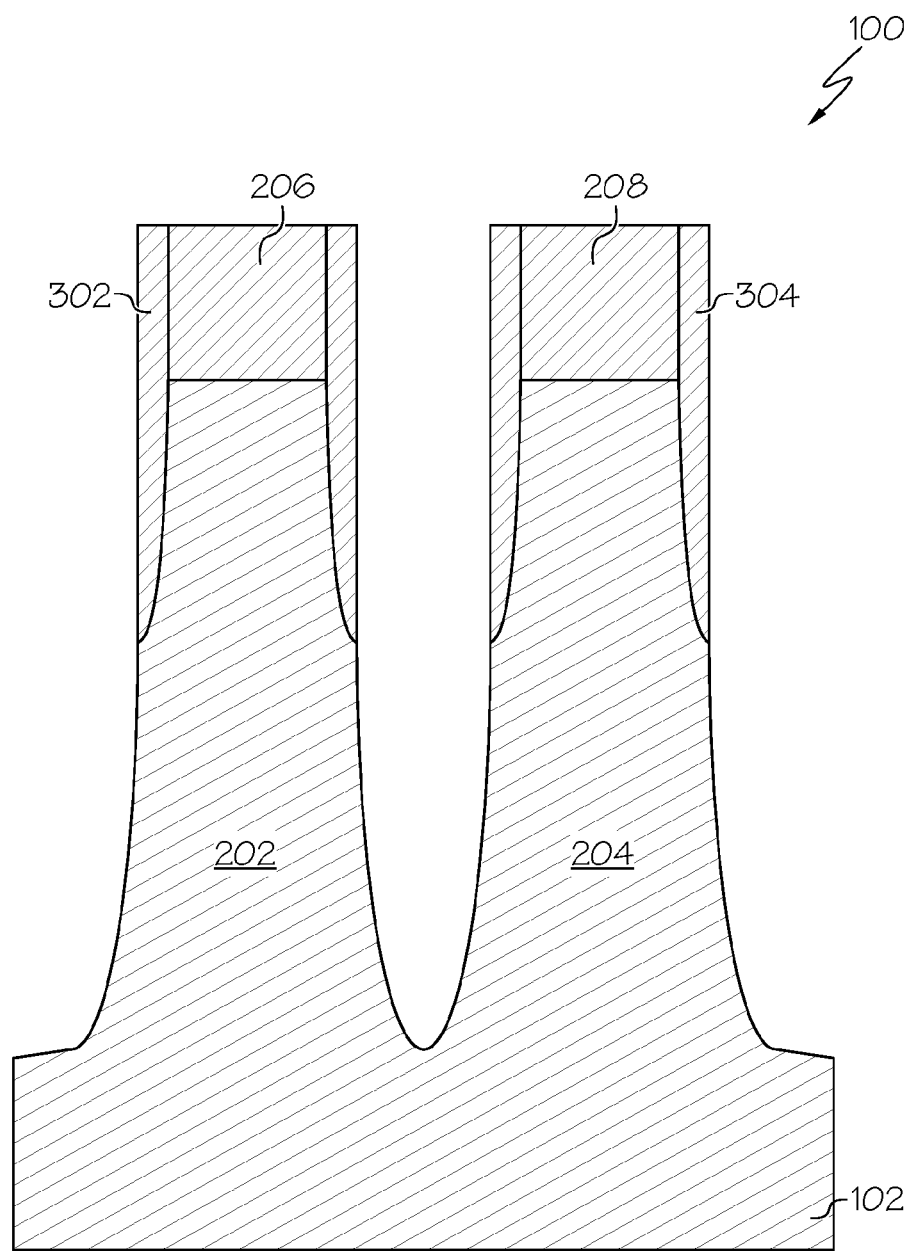
FIG. 4 is a cross-sectional view of the semiconductor structure after the semiconductor structure has been further etched to extend the fins structures under the first spacers according to one embodiment of the present invention.

After the fins 202, 204 have been formed, a spacer material is conformally deposited over the structure 100 using one or more processes such as ALD, CVD, PVD, a combination thereof, and/or the like. In one embodiment, the spacer material is a nitride material but other materials are applicable as well. An etching process such as RIE is performed to form spacers 302, 304 on the sidewalls of the fins 202, 2024, as shown in FIG. 3. An additional directional etching process (e.g., RIE) is then performed to further etch the exposed portions of the substrate 102 below the spacers 302, 304. This process etches further down into the substrate 102 increasing the height of the fins 202, 204 and further tapering the sidewalls of the fins 202, 204, as shown in FIG. 4. In one embodiment, the etch depth ranges from 20-50 nm, although lesser and greater depths are applicable.

Figure 5:
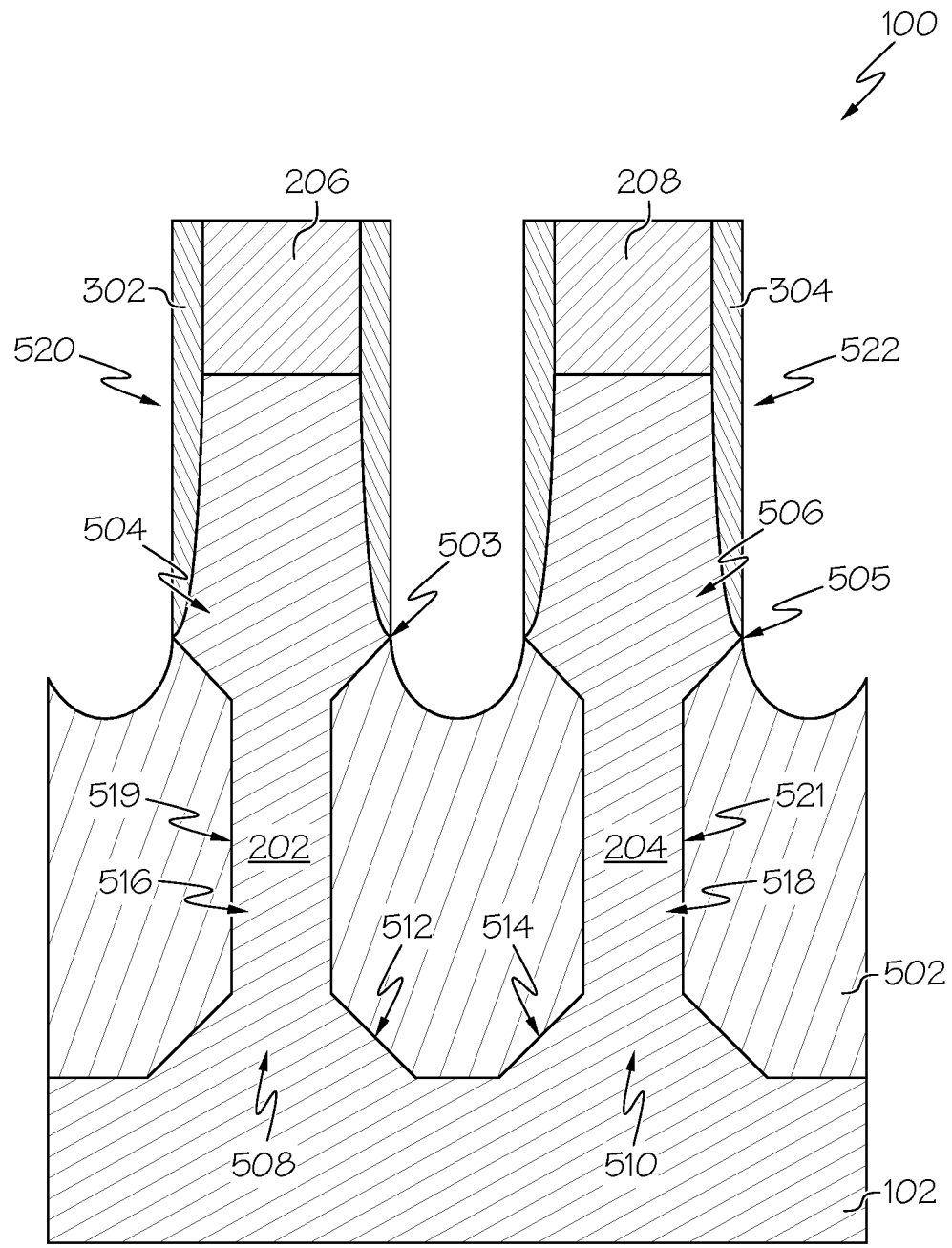
FIG. 5 is a cross-sectional view of the semiconductor structure after an oxide has been formed on exposed portions of the fin structures and faceted regions have been formed in the fin structures according to one embodiment of the present invention.

A thermal oxidation process is then performed to oxidize the fins 202, 204 below the spacer 302, 304, as shown in FIG. 5. One example of a thermal oxide process is a raid thermal oxidation (RTP) process at 1100 C for 2 min in oxygen environment. Another example is a furnace oxidation at 800 C for 2 hours in oxygen environment. A further example is a furnace oxidation at 650 C for 2 hours in water vapor environment. Oxidation with oxygen is often referred to as dry oxidation. Oxidation with water vapor is often referred to as wets oxidation. The oxidation process forms an oxide 502 surrounding each fin 202, 204 and creates a top faceted portion 504, 506 in an exposed top region 503, 505 of the fins 202, 204. This process further creates a bottom faceted fin portion 508, 510 in an exposed bottom region 512, 514 of each fin 202, 204 as well. The oxidation process further creates a substantially vertical portion 516, 518 in an exposed middle region 519, 521 of each fin 202, 204 between and in contact with the top faceted portions 504, 506 and bottom faceted portions 508, 510. In one embodiment, an optional oxide film (not shown) is deposited on the sidewalls of the exposed portions of the fins 302, 304 to allow for better control of the oxidation process.

The faceted portions 504, 506, 508, 510 and the vertical portions 516, 518 are formed because of the oxidation process reacting at different rates with the various planes of the exposed portions of the fins 202, 204. As discussed above, the fins 202, 204 have tapered sidewalls. Therefore, the fins 202, 204 have a highly indexed crystalline structure with the various planes being oxidized at different rates. This results in the exposed top regions 503, 505; bottom regions 512, 514, and middle regions 519, 521 of the fins 202, 204 being oxidized at different rates resulting in the structure shown in FIG. 5. In one embodiment, the top faceted portion 504, 506 of each fin 202, 204 comprises a {111} plane; the vertical portion 516, 518 comprises a plane; and the bottom faceted portion 508, 510 comprises a {111} plane. However, other planes are applicable as well.

The portion 520, 522 of the fins 202, 204 surrounded by the spacers 302, 304 is protected from the oxidation process. Therefore, in some embodiments, this portion 520, 522 of the fins and the top faceted portion 504, 506 form a dog-bone shape. Each non-oxidized portion 520, 522 of the fins has tapered sidewalls comprising a greater width in a region closest to the top faceted portion 504, 506 than a width in a region closest to the top surface of the fin 202, 204, which is in contact with the hardmask layer 206, 208. In other words, the width gradually decreases from a lower region of the non-oxidized portion 520, 522 to an upper region of the non-oxidized portion 520, 522. Each top faceted portion 504, 506 includes a greater width in an upper region than in a lower region. In other words, the width gradually decreases towards the vertical portion 516, 518. Each bottom faceted portion 508, 510 includes a greater width in a lower region than in an upper region. In other words, the width gradually increases towards the vertical portion 516, 518. Each vertical portion 516, 518 comprises a substantially consistent width that is less than the widths of the non-oxidized portion 520, 522 and the widths of at least an upper area of the top faceted portion 504, 506 and at least a lower area of the bottom faceted portion 508, 510.

Figure 6:
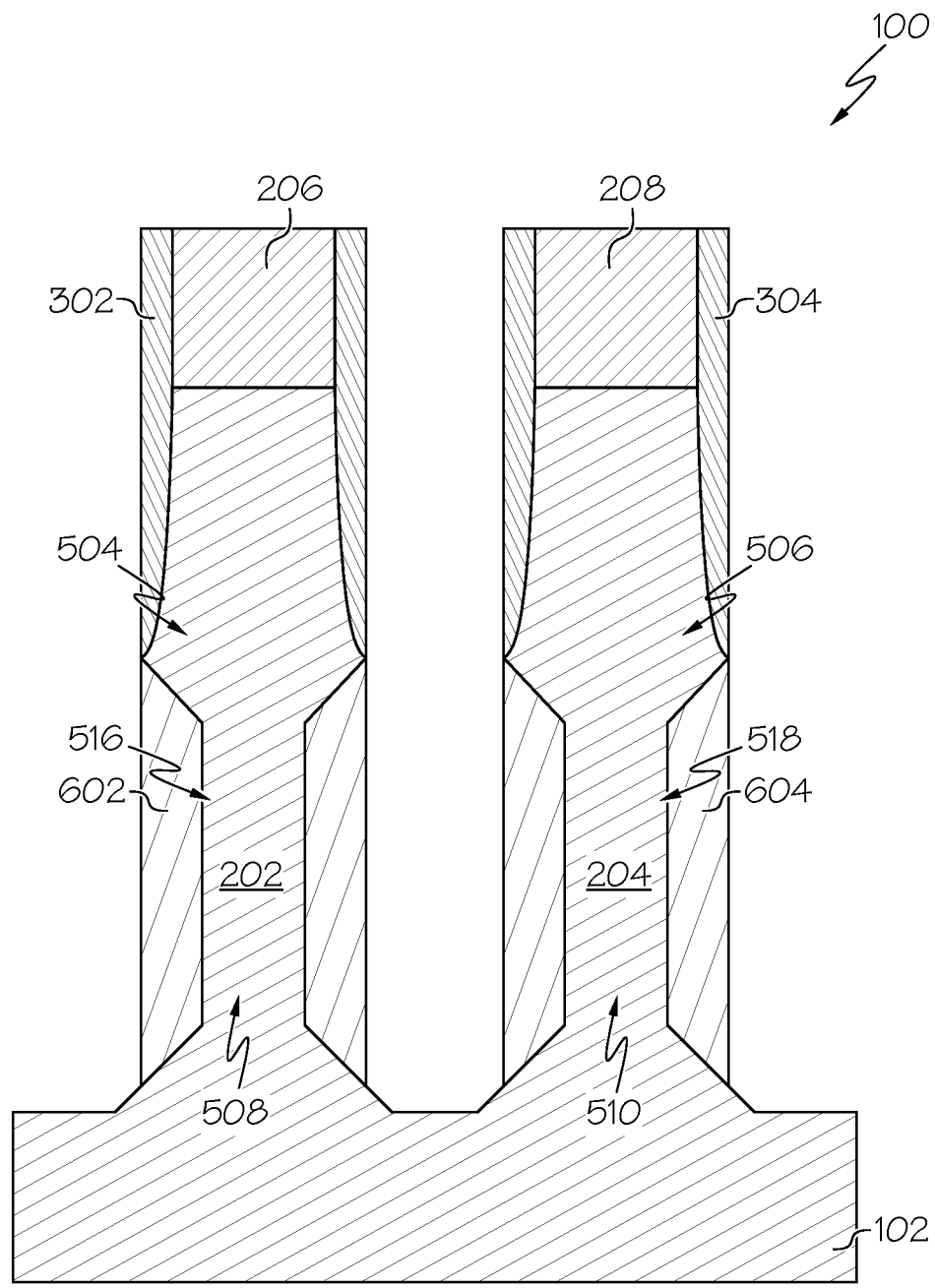
FIG. 6 is a cross-sectional view of the semiconductor structure after portions of the oxide extending laterally beyond the first spacers have been removed to create a second spacer according to one embodiment of the present invention.
Figure 7:
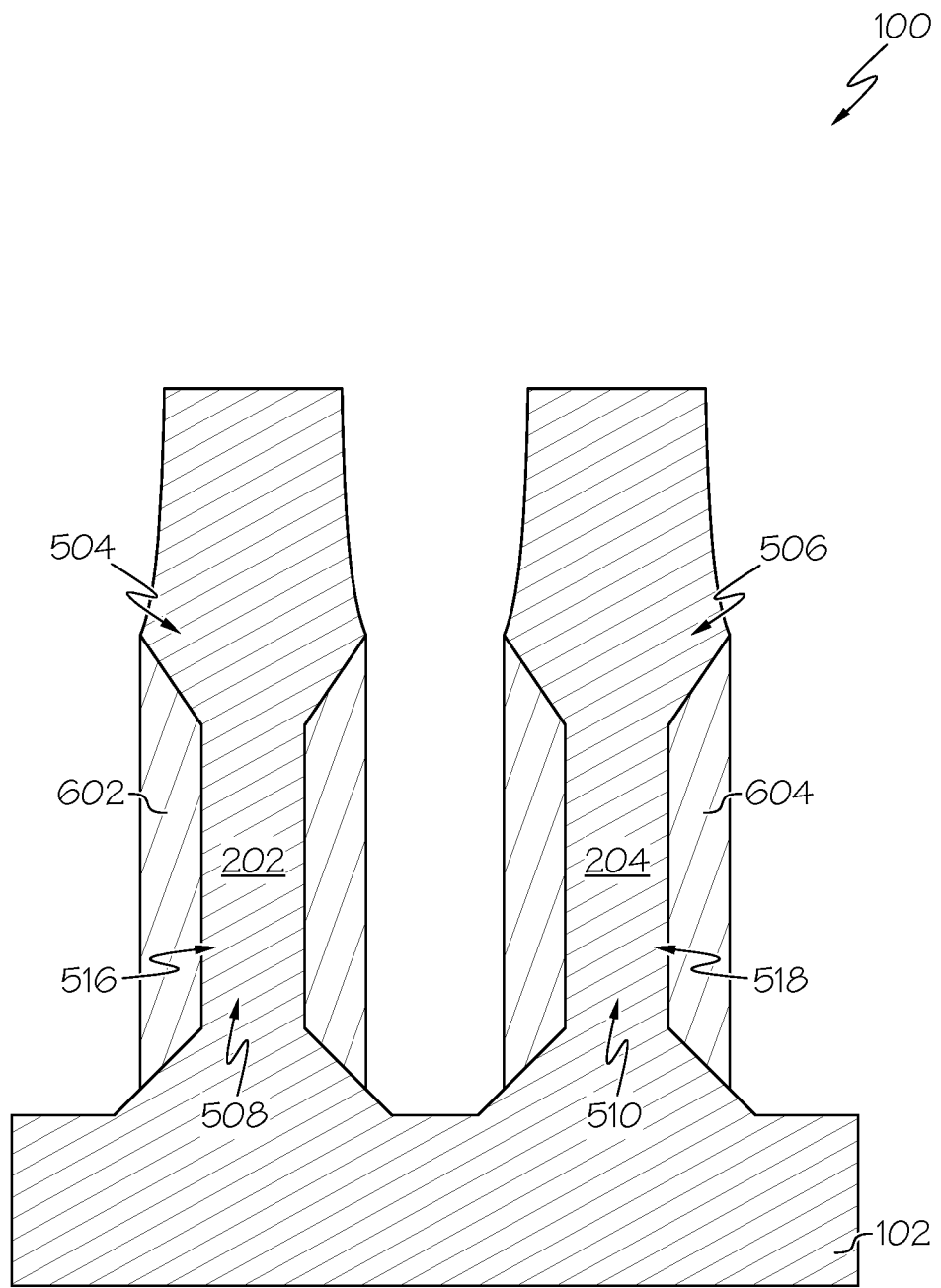
FIG. 7 is a cross-sectional view of the semiconductor structure after the first spacers have been removed according to one embodiment of the present invention.

FIG. 6 shows that once the oxide 502 has been formed a directional etch (e.g. RIE) is performed using the spacers 302, 304 as a hardmask to form oxide spacers 602, 604 on the exposed sidewalls of the fins 202, 204. For example, portions of the oxide 502 extending laterally beyond the spacers 302, 304 are etched away for form the oxide spacers 602, 604. The fin hardmasks 206, 208 and the spacers 302, 304 are then removed, as shown in FIG. 7. For example, one or more processes such as chemical-mechanical polishing (CMP), selective etching, wet stripping, and/or the like can be used to remove the fin hardmasks 206, 208 and the spacers 302, 304.

Figure 8:
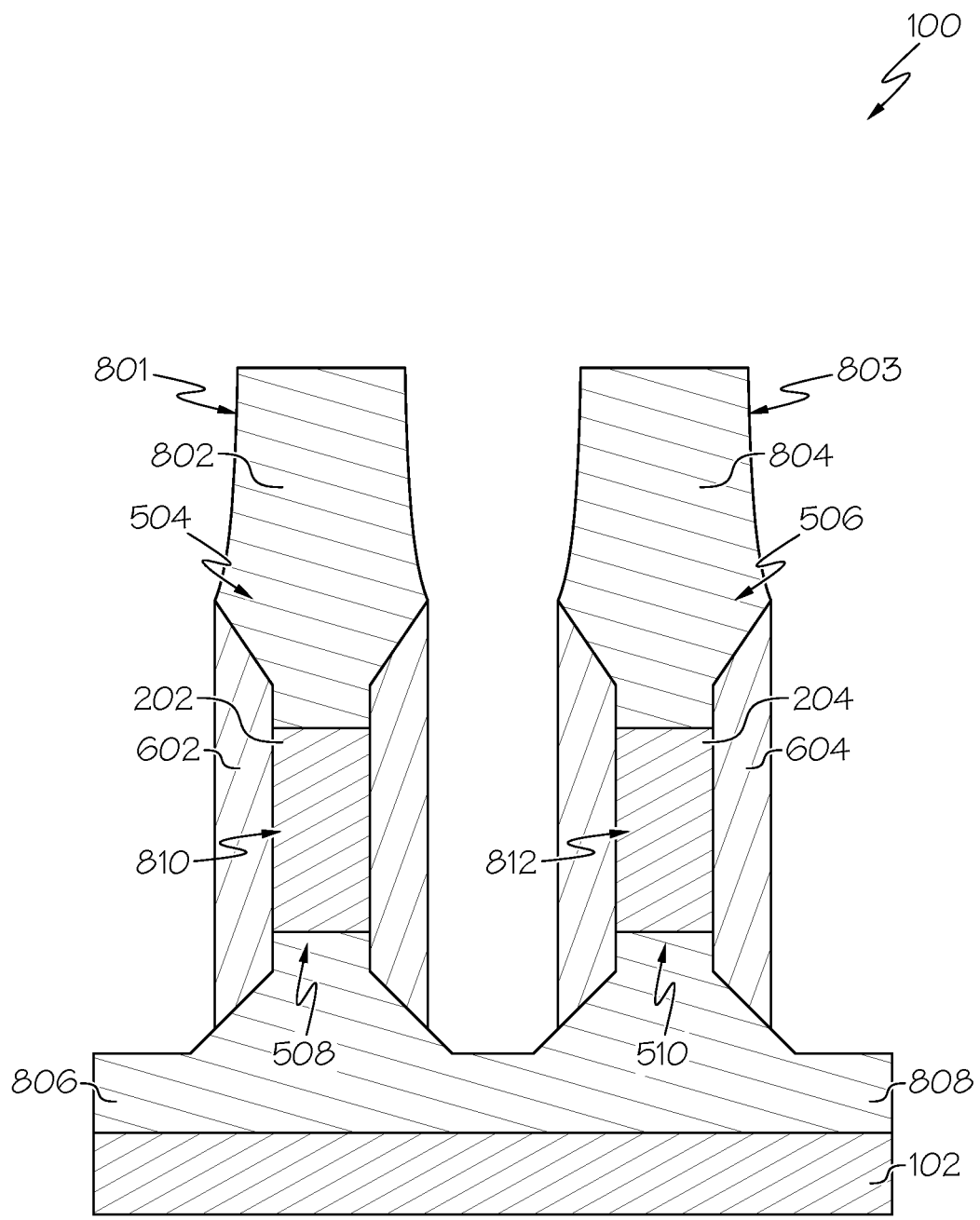
FIG. 8 is a cross-sectional view of the semiconductor structure after top source/drain and a bottom source/drain have been formed according to one embodiment of the present invention.

FIG. 8 shows that the exposed top portions 801, 803 of the fins 202, 204 not surrounded by the oxide spacers 602, 604 and a portion of the substrate are doped to form top and bottom source/drains 802, 804, 806, 808. As shown in FIG. 8, the oxide spacers 602, 604 act as a dopant diffusion barrier such that dopants are incorporated into the top portion 801, 803 of each fin 202, 204; the top faceted portion 504, 506 of each fin 202, 204; the bottom faceted portion 508, 510 of each fin 202, 204; and a portion of the semiconductor substrate 102. The oxide spacers 602, 604 protect the vertical portions 516, 518 of the fins from the doping process such that at least a part of the vertical portion 516, 518 remains undoped. The undoped regions act as the channel regions 810, 812 for the structure 100.

The doping of the exposed portions of each fin 202, 204 and the portion of the substrate 102 is performed, in one embodiment, using a process such as gas phase doping, plasma doping, or gas cluster ion beam doping. Other doping techniques suitable for this invention: ion implantation, plasma immersion ion implantation, cluster doping, infusion doping, liquid phase doping, solid phase doping, etc. The exposed portions of each fin 202, 204 and the portion of the substrate 102 are appropriately doped either with p-type dopant atoms and/or with n-type dopant atoms. P-type doping is produced by doping the material with elements from group III of the periodic table (e.g., boron, aluminum, gallium, or indium). As an example, the dopant is boron in a concentration ranging from $1\times10^{19}$ atoms/cm3 to $1\times10^{21}$ atoms/cm$^3$. N-type doping is produced by doping the material with elements from group V of the periodic table (e.g., phosphorus, antimony, or arsenic). As an example, the dopant is phosphorus in a concentration ranging from $1\times10^{19}$ atoms/cm3 to $1\times10^{21}$ atoms/cm$^3$. Greater or lesser doping concentration is also conceived.

Depending on the doping technique, an annealing process can then be performed to activate the top source/drains 802, 804 and the bottom source/drains 806, 808. The annealing, in one embodiment, is conducted using a furnace anneal, rapid thermal anneal (RTA), flash anneal, laser anneal, or any suitable combination of those annealing processes. In one embodiment, the temperature of activation anneal ranges from 700° C. to 1300° C., although lesser and greater temperatures also apply. The time period for the annealing process may range from 10 nanoseconds to 100 seconds, although lesser and time periods also apply. As shown in FIG. 8, the top and bottom source/drains 802, 804, 806, 808 are formed self-aligned to the oxide spacers 602, 604. Stated differently, the structure 100 comprises symmetric top and bottom source/drains 802, 804, 806, 808 to channel junctions 810, 812.

Figure 9:
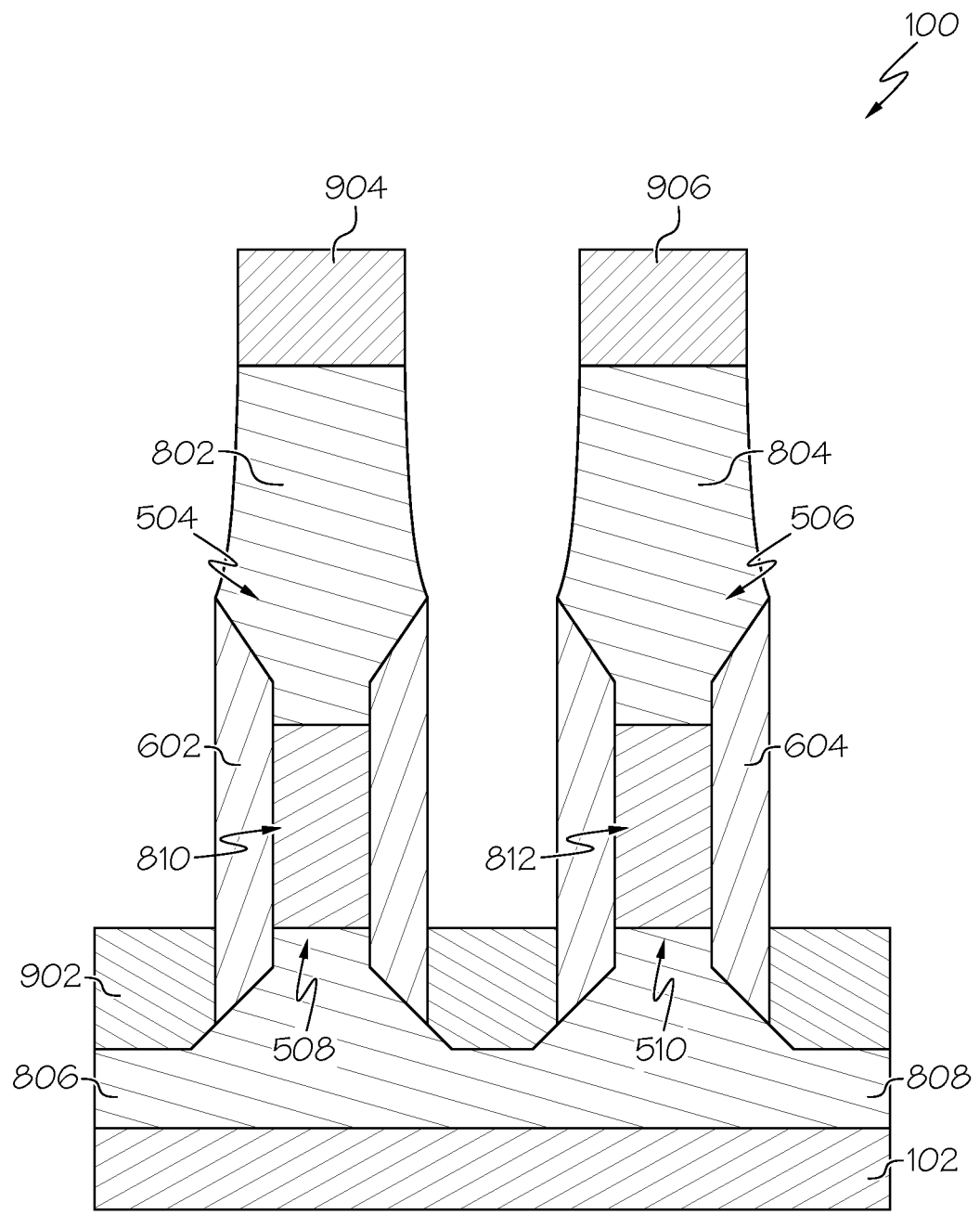
FIG. 9 is a cross-sectional view of the semiconductor structure after a bottom spacer has been formed according to one embodiment of the present invention.

A bottom spacer 902 is then formed in contact with any exposed portion of the bottom source/drain regions 806, 808, as shown in FIG. 9. The bottom spacer 902 is also formed in contact with exposed portions of the oxide spacers 602, 604. In one embodiment, the bottom spacer 902 includes an insulating material (such as silicon oxide, silicon nitride, silicon oxynitride, SiBCN, SiOCN, SiOC, or a combination of these), and is formed using a directional deposition process such as high density plasma (HDP) deposition, physical vapor deposition (PVD), or gas cluster ion beam (GCIB) deposition. However, other deposition process such as CVD and subsequent etching techniques are applicable as well. The deposited spacer material is then subsequently etched to form the final spacer structure. In one embodiment, the height of the bottom spacer 902 substantially corresponds to the height of the bottom source/drain regions 806, 808.

Figure 10:
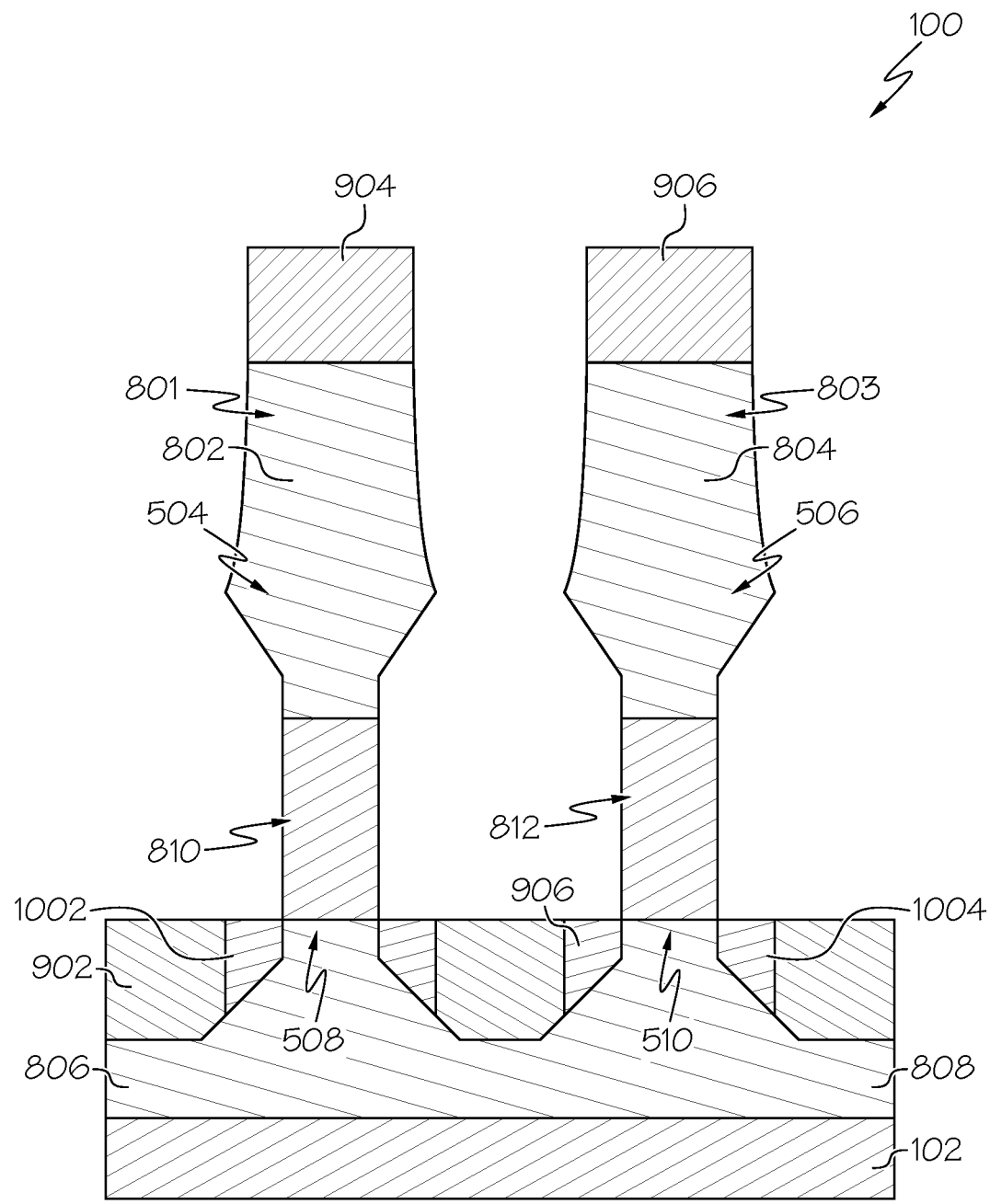
FIG. 10 is a cross-sectional view of the semiconductor structure after exposed portions of the second spacers have been removed according to one embodiment of the present invention.

FIG. 9 also shows that a cap layer 904, 906 is formed on and in contact with the top source/drains 802, 804 of each fin 202, 204. In one embodiment, the cap layer 904, 906 is formed as part of the directional deposition process that forms the bottom spacer 902, and comprises the same material as the bottom spacer 902. However, the cap layers 904, 906 can be formed using a separate process and can include a different material than the bottom spacer material. An etching process such as wet etch process, containing hydrofluoric acid, or a dry etch such as chemical oxidation removal (COR) process, is performed to etch the oxide spacers 602, 604 down to the bottom spacer 902, as shown in FIG. 10. This process exposes the sidewalls of the channel region 810, 812 and the top faceted portion 504, 506 of the top source/drain 802, 804. A portion 1002, 1004 of the oxide spacers 602, 604 remains between the bottom spacer 902 and the bottom source/drain 806, 808.

Figure 11:
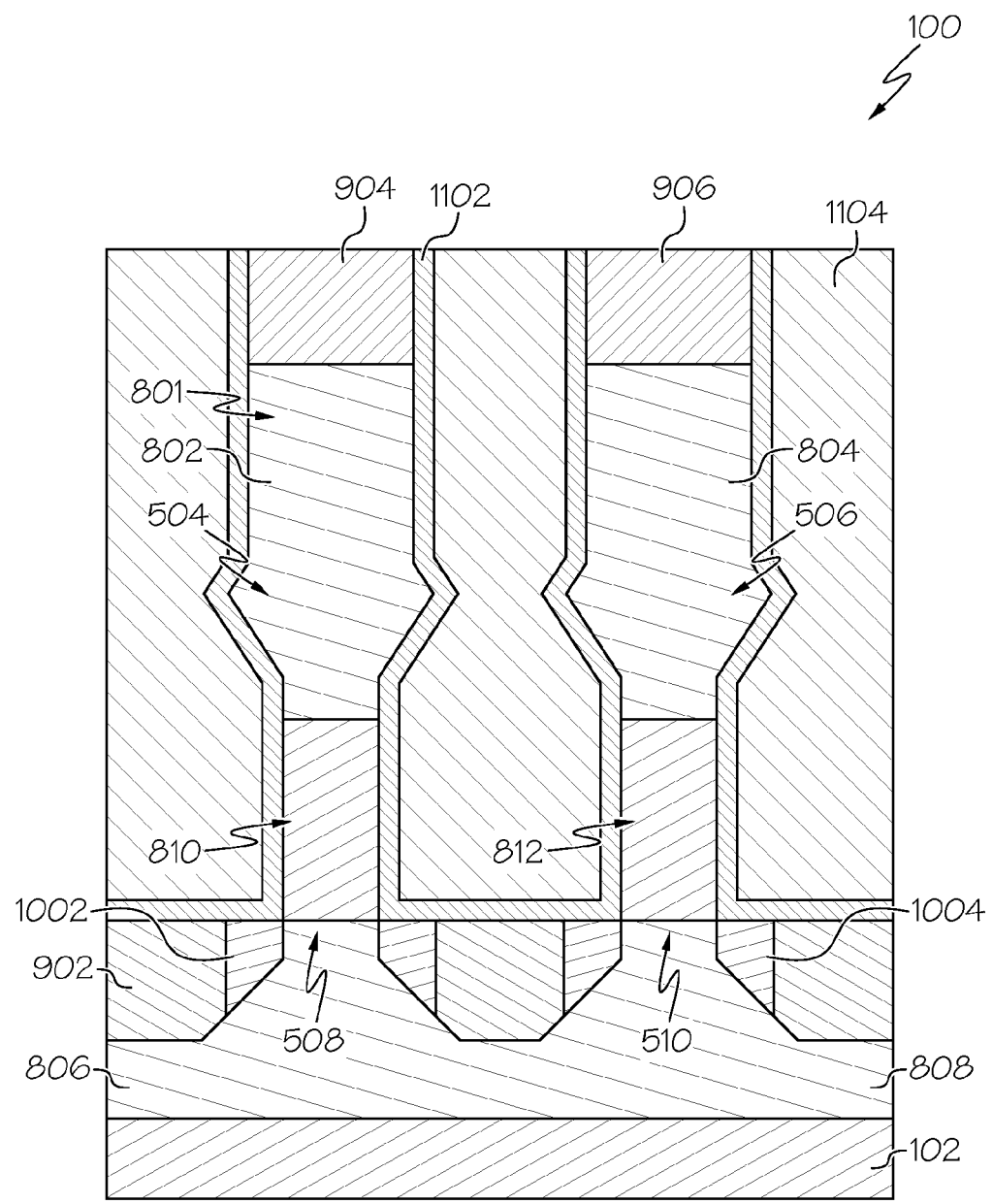
FIG. 11 is a cross-sectional view of the semiconductor structure after a dielectric material and conducting gate material have been deposited according to one embodiment of the present invention.

A gate dielectric material 1102 is then formed on the exposed sidewalls of the fins. The gate dielectric material 102 may comprise: silicon oxide, silicon nitride, silicon oxynitride, boron nitride, high-k materials, or any combination of these materials. In one embodiment, the gate dielectric comprises a high-k dielectric and is blanket deposited over the entire structure 100, for example by CVD (chemical vapor deposition), PECVD (plasma enhanced chemical vapor deposition), or ALD (Atomic layer deposition), as shown in FIG. 11. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material 1102 can further include dopants such as lanthanum or aluminum.

Figure 12:
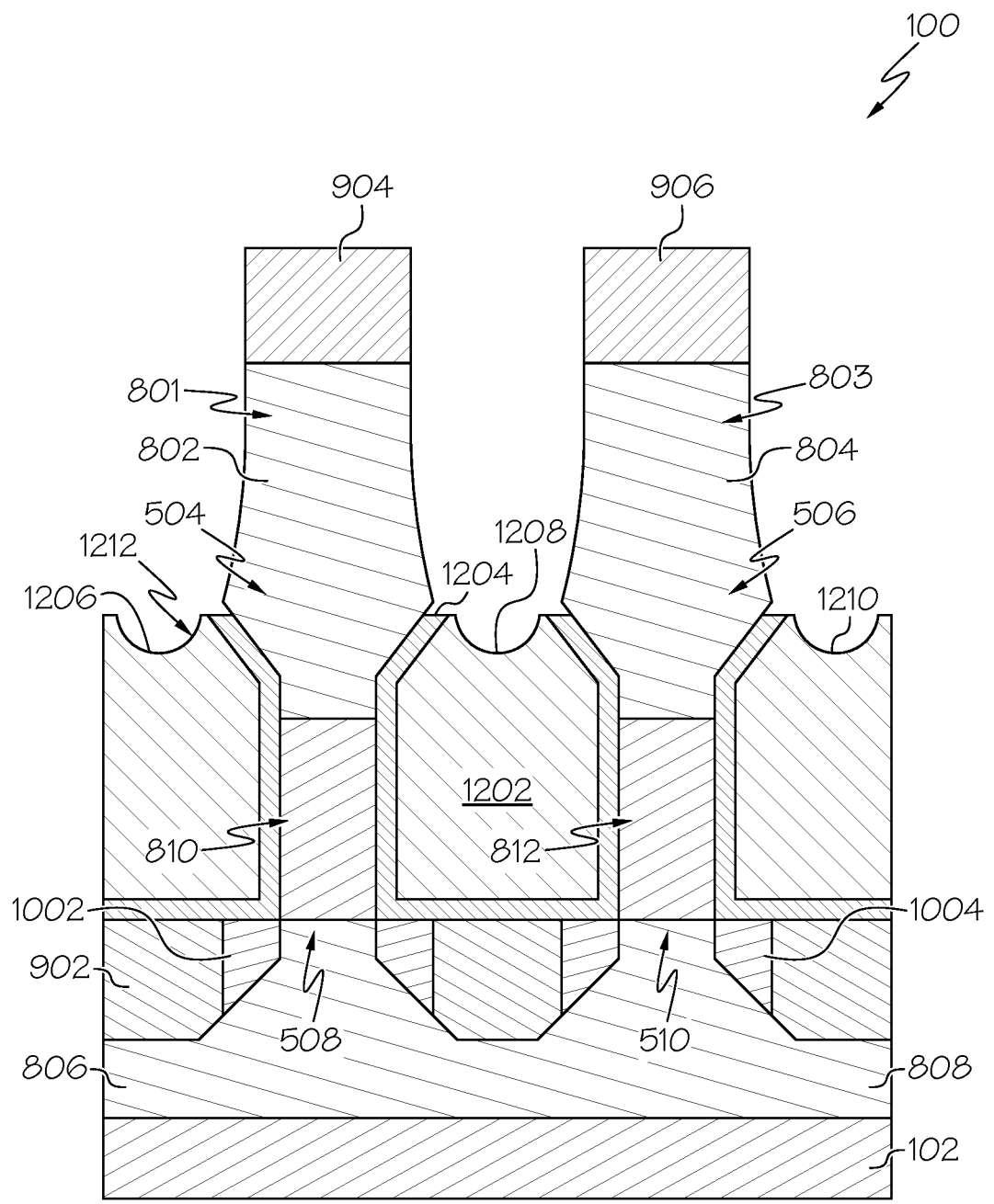
FIG. 12 is a cross-sectional view of the semiconductor structure after the dielectric material and conducting gate material have been recessed to form a dielectric layer and gate according to one embodiment of the present invention.

FIG. 11 also shows that a conducting gate material 1104 is also deposited over the entire structure 100 by, for example, atomic layer deposition (ALD) or physical vapor deposition (PVD). Gate conducting material can be: polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. In some embodiment, the gate conducting material may further comprise a gate workfunction setting layer over the gate dielectric. gate workfunction setting layer can be: doped silicon, doped silicon germanium, doped germanium, a metallic nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a metallic carbide, including but not limited to titanium carbide (TiC) titanium aluminum carbide (TiAlC), tantalum carbide (TaC), hafnium carbide (HfC), and combinations thereof. In one embodiment, the conducting gate material 1104 includes, for example, tungsten. However, other materials are applicable as well. A planarization process is then performed to polish the dielectric material 1102 and conducting gate material 1104 down to the cap layer 904, 906 of each fin 202, 204. One or more directional etching processes such as RIE are then performed to recess the conducting gate material 1104 and dielectric material 1102 forming a gate 1202 and a dielectric layer 1204, as shown in FIG. 12. In one embodiment, the conducting gate material 1104 is recessed before the dielectric material 1204. In another embodiment, the conducting gate material and the dielectric material are recessed together. The dog-bone shape of the top source/drain 504, 506 helps alleviate recess variation.

In one embodiment, the gate 1202 is a continuous gate that wraps around all the fins 202, 204 and contacts the dielectric layer 1204. The gate 1202, in one embodiment, is recessed below a top portion of the top faceted area 504, 506 where the top faceted area 504, 506 transitions to the upper portion 801, 803 of the top source/drain 802, 804. The directional etching process also recesses the conducting gate material 1104 such that a dip or a concavity is formed 1206, 1208, 1210 at the top surface 1212 of the gate 1202 between the fins 202, 204 and adjacent to each fin 202, 204. The recessing of the dielectric material forms a dielectric layer 1204 on and in contact with the top surface of the bottom spacer 902; the top surface of the remaining oxide spacer portions 1002, 1004; any exposed portion of the bottom source/drain 806, 808; sidewalls of the channel 818, 820; and a portion of the top faceted area 504, 506 of the top source/drain 802, 804.

The gate 1202 and dielectric layer 1204 are formed such that an upper portion of the top faceted area 504, 506 remains exposed. As shown in FIG. 12, a top surface of the gate 1202 does not extend above and is at least partially co-planar with the top surface of the dielectric layer 1204. However, the dips/concavities 1206, 1208, 1210 of the gate 1202 extend below the top surface of the gate 1202 and the dielectric layer 1204. The dips/concavities 1206, 1208, 1210 of the gate 1202 are advantageous because they situate the gate 1202 further away from the top source/drain 802, 804 thereby reducing the parasitic capacitance of the device and increasing device performance.

Figure 13:
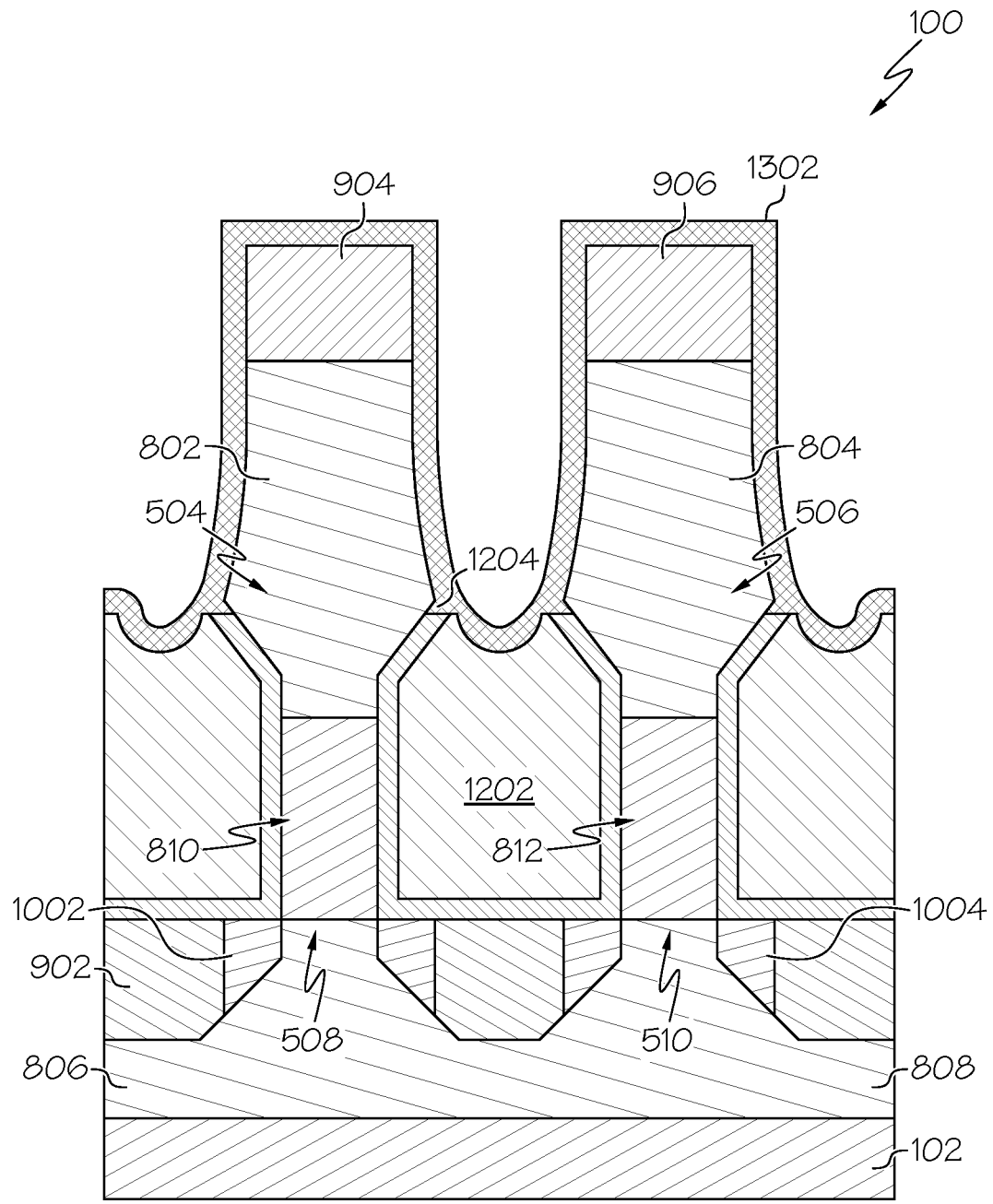
FIG. 13 is a cross-sectional view of the semiconductor structure after a dielectric layer has been formed over the structure according to one embodiment of the present invention.
Figure 14:
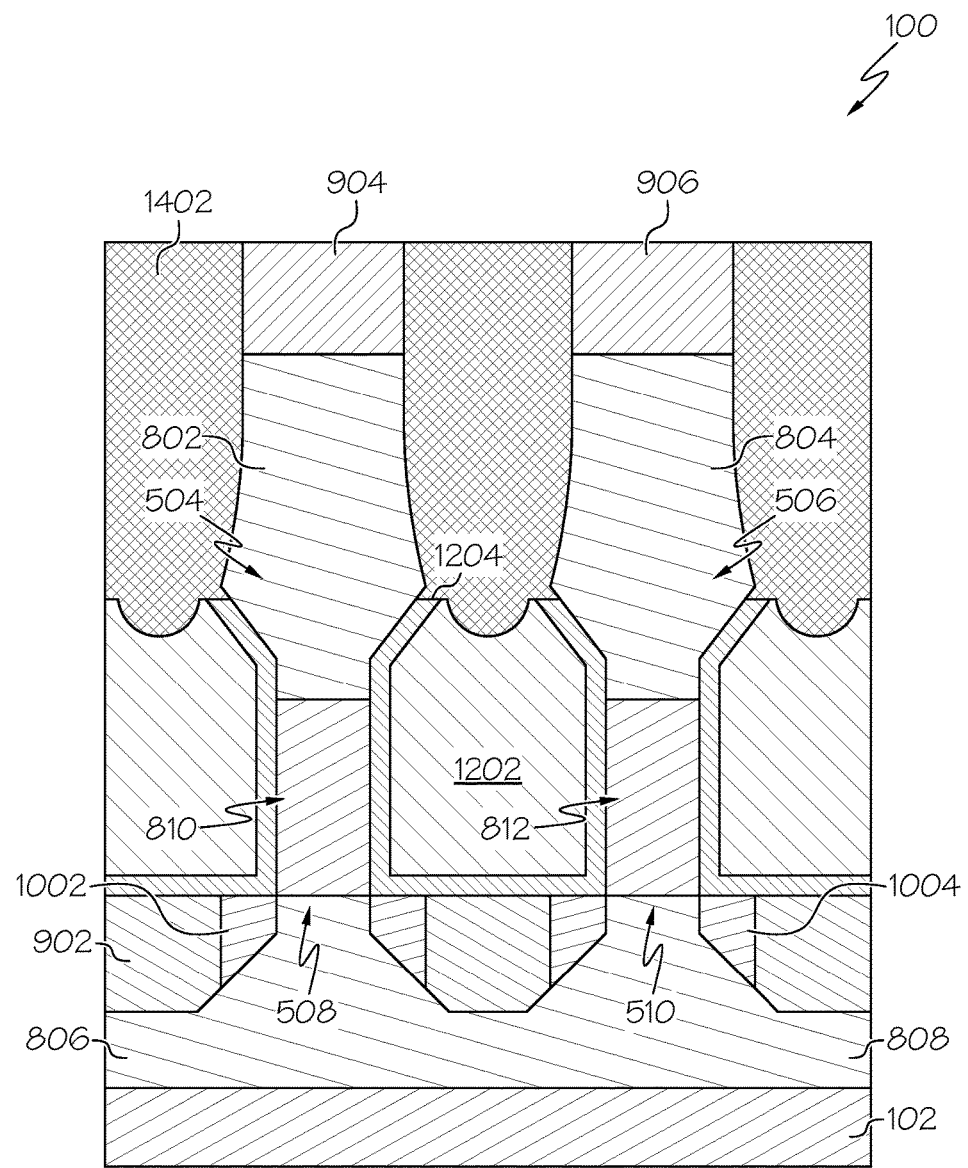
FIG. 14 is a cross-sectional view of the semiconductor structure after an oxide material has been deposited in contact with the dielectric layer to form a top spacer according to one embodiment of the present invention.

A top spacer layer 1302 is then formed on the structure 100, as shown in FIG. 13. The top spacer layer 1302 contacts any exposed portions of the gate 1202, any exposed portions of the dielectric layer 1204, any exposed portions of the top source/drain 504, 506, and any exposed portions of the cap layer 904, 906. In one embodiment, the top spacer layer 1302 includes the same or different material as the bottom spacer 902. For example, the top spacer layer 1302 can include an insulating material (such as silicon oxide, silicon nitride, silicon oxynitride, SiBCN, SiOCN, SiOC, or a combination of these). A fill process is then performed over the top spacer layer 1302. In one embodiment, the fill process include a flowable oxide deposition followed by a thermal anneal (e.g., 450-600 C for 10 min to 2 hours). A planarization process is performed to remove excess material and the cap layers 904, 906 down to the top surface of the top source/drain 504, 506. This process forms the final top spacer structure 1402, as shown in FIG. 14. Conventional fabrication techniques can then be performed to complete the device(s).

Figure 15:
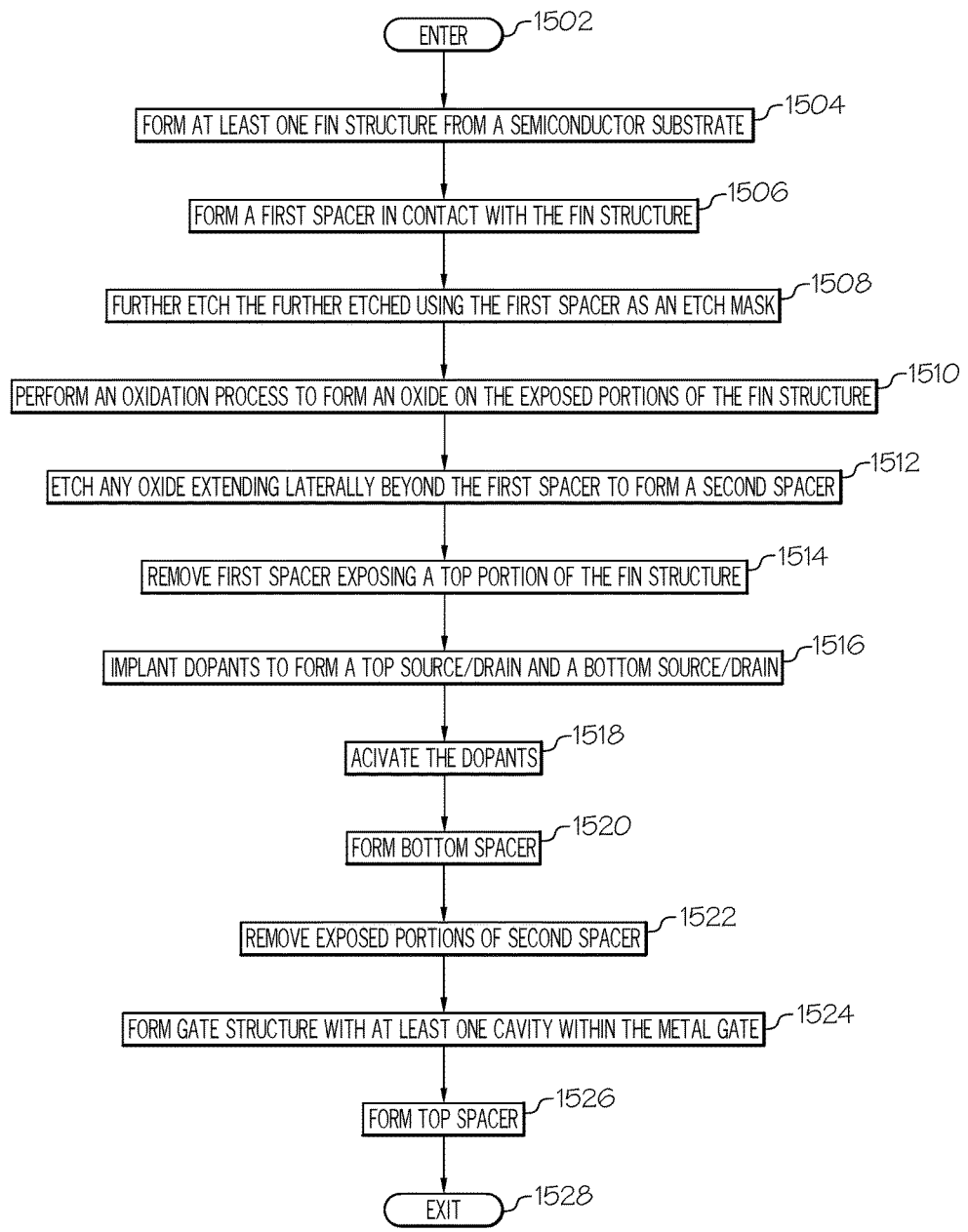
FIG. 15 is an operational flow diagram illustrating one process for fabricating vertical fin field-effect-transistor according to one embodiment of the present invention.

FIG. 15 is an operational flow diagram illustrating one process for fabricating a vertical fin field-effect-transistor. It should be noted that each of the steps shown in FIG. 15 has been discussed in greater detail above with respect to FIGS. 1-14. In FIG. 15, the operational flow diagram begins at step 1502 and flows directly to step 1504. At least one fin structure, at step 1504, is formed from a semiconductor substrate. The at least one fin structure comprises a tapered profile. A first spacer, at step 1506, is formed in contact with the fin structure. The semiconductor substrate, at step 1508, is further etched using the first spacer as an etch mask. This process extends the fin structure below the first spacer and continues the tapered profile of the fin structure.

An oxidation process, at step 1510, is performed to form an oxide on the exposed portions of the fin structure under the first spacer. During the formation of the oxide, different areas of the exposed portions of the fin structure are oxidized at different rates forming a first region and a second region of the exposed portion. The first region and the second region each have a width that gradually decreases towards a third region of the exposed portion situated between the first and second regions.

Any oxide extending laterally beyond the first spacer is etched to form a second spacer in contact with the first, second, and third regions of the fin structure, at step 1512. The first spacer, at step 1514, is removed exposing a top portion of the fin structure. Dopants, at step 1516, are incorporated into the top portion, first region, and second region of the fin structure and a portion of the semiconductor substrate to form a top source/drain and a bottom source/drain. An anneal, at step 1518 is performed to activate the dopants. A bottom spacer, at step 1520, is formed in contact with the bottom source/drain and a portion of the second spacer. Exposed portions of the second spacer, at step 1522, are removed. A gate structure, at step 1524, is formed in contact with the fin structure below an upper portion of the first region of the fin structure. The gate structure includes a dielectric layer and a gate layer, wherein forming the gate structure comprises forming at least one concavity within a top surface of the gate layer. A top surface of the gate within the concavity is below a top surface of the dielectric layer. A top spacer, at step 1526, is formed in contact with the gate structure, the top portion of the fin structure, and the cap layers. The control flow then exits at step 1528.

Although specific embodiments of the invention have been disclosed, those having ordinary skill in the art will understand that changes can be made to the specific embodiments without departing from the spirit and scope of the invention. The scope of the invention is not to be restricted to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A vertical fin field-effect-transistor comprising at least:
   a substrate;
   a first source/drain disposed in contact with the substrate;
   a second source/drain disposed above the first source/drain; and
   at least one fin structure disposed between and in contact with the first source/drain and the second source/drain,
   wherein a width of the first source/drain and a width of the second source/drain gradually decreases towards the fin structure, and wherein the second source/drain comprises an upper portion having a tapered width that gradually increases towards the fin structure.

2. The vertical fin field-effect-transistor of claim 1, wherein the first source/drain comprises a faceted portion in contact with the fin structure.

3. The vertical fin field-effect-transistor of claim 1, further comprising:
   an oxide spacer in contact with a faceted portion of the first source/drain, wherein the faceted portion of the first source/drain is contact with the fin structure.

4. The vertical fin field-effect-transistor of claim 1, further comprising:
   a bottom spacer in contact with the first source/drain;
   a gate structure in contact with the bottom spacer, the fin structure, and the second source/drain; and
   a top spacer in contact with the gate structure and the second source/drain.

5. The vertical fin field-effect-transistor of claim 4, wherein a portion of the top spacer extends below a top surface of the gate structure.

6. The vertical fin field-effect-transistor of claim 4, wherein a portion of the top spacer tapers inward towards the gate structure.

7. The vertical fin field-effect-transistor of claim 4, wherein the gate structure comprises:
   a dielectric layer in contact with the bottom spacer, the fin structure, and a portion of the second source/drain layer,
   a gate in contact with the dielectric layer, wherein the gate comprises at least one concavity formed in the top surface of the gate, wherein a top surface of the gate within the concavity is below a top surface of the dielectric layer.

8. The vertical fin field-effect-transistor of claim 7, wherein a first portion of the top spacer extends below a top surface of the gate structure and contacts the gate, and wherein a second portion of the top spacer contacts the dielectric layer.

9. The vertical fin field-effect-transistor of claim 1, further comprising:
   a cap layer formed on and in contact with the second source/drain.

10. An integrated circuit comprising:
    at least one vertical fin field-effect-transistor comprising at least:
    a substrate;
    a first source/drain disposed in contact with the substrate;
    a second source/drain disposed above the first source/drain; and
    at least one fin structure disposed between and in contact with the first source/drain and the second source/drain,
    wherein a width of the first source/drain and a width of the second source/drain gradually decreases towards the fin structure, and wherein the second source/drain comprises an upper portion having a tapered width that gradually increases towards the fin structure.

11. The integrated circuit of claim 10, wherein the first source/drain comprises a faceted portion in contact with the fin structure.

12. The integrated circuit of claim 10, wherein the at least one vertical fin field-effect-transistor further comprises:
an oxide spacer in contact with a faceted portion of the first source/drain, wherein the faceted portion of the first source/drain is contact with the fin structure.

13. The integrated circuit of claim 10, wherein the at least one vertical fin field-effect-transistor further comprises:
a bottom spacer in contact with the first source/drain;
a gate structure in contact with the bottom spacer, the fin structure, and the second source/drain; and
a top spacer in contact with the gate structure and the second source/drain.

14. The integrated circuit of claim 13, wherein a portion of the top spacer extends below a top surface of the gate structure.

15. The integrated circuit of claim 13, wherein a portion of the top spacer tapers inward towards the gate structure.

16. The integrated circuit of claim 13, wherein the gate structure comprises:
a dielectric layer in contact with the bottom spacer, the fin structure, and a portion of the second source/drain layer;
a gate in contact with the dielectric layer, wherein the gate comprises at least one concavity formed in the top surface of the gate, wherein a top surface of the gate within the concavity is below a top surface of the dielectric layer.

17. The integrated circuit of claim 16, wherein a first portion of the top spacer extends below a top surface of the gate structure and contacts the gate, and wherein a second portion of the top spacer contacts the dielectric layer.

18. The vertical fin field-effect-transistor of claim 10, wherein the at least one vertical fin field-effect-transistor further comprises:
a cap layer formed on and in contact with the second source/drain.

* * * * *